(12) United States Patent
Butler et al.

(10) Patent No.: US 8,245,824 B2
(45) Date of Patent: Aug. 21, 2012

(54) COMBINATION OF STRUCTURE AND AN ACTIVE DAMPING SYSTEM, AND A LITHOGRAPHIC APPARATUS

(75) Inventors: Hans Butler, Best (NL); Marc Wilhelmus Maria Van Der Wijst, Veldhoven (NL); Joost De Pee, Veldhoven (NL); Cornelius Adrianus Lambertus De Hoon, Best (NL); Stijn Boschker, Pijnacker (NL)

(73) Assignee: ASML Netherlands B.V., Veldhoven (NL)

( * ) Notice: Subject to any disclaimer, the term of this patent is extended or adjusted under 35 U.S.C. 154(b) by 786 days.

(21) Appl. No.: 12/267,809

(22) Filed: Nov. 10, 2008

(65) Prior Publication Data

US 2009/0180092 A1    Jul. 16, 2009

Related U.S. Application Data

(60) Provisional application No. 60/996,503, filed on Nov. 20, 2007.

(51) Int. Cl.
*F16F 7/10* (2006.01)
*G03B 27/42* (2006.01)
(52) U.S. Cl. .......................... 188/378; 355/53
(58) Field of Classification Search ............ 355/53, 355/55; 188/266.1, 266, 7, 280, 321, 11, 188/378–380; 318/649, 671
See application file for complete search history.

(56) References Cited

U.S. PATENT DOCUMENTS

| 5,033,028 | A  | * | 7/1991  | Browning ................. 367/1 |
| 5,823,307 | A  | * | 10/1998 | Schubert et al. ............ 188/378 |
| 6,193,206 | B1 | * | 2/2001  | Yasuda et al. ................. 248/550 |
| 6,472,840 | B1 | * | 10/2002 | Takahashi ..................... 318/649 |
| 7,292,317 | B2 | * | 11/2007 | Cox et al. ..................... 355/72 |
| 8,059,259 | B2 | * | 11/2011 | Butler et al. .................... 355/53 |
| 8,164,737 | B2 | * | 4/2012  | Butler et al. .................... 355/53 |
| 2002/0149754 | A1 | * | 10/2002 | Auer et al. ..................... 355/53 |
| 2006/0272910 | A1 |   | 12/2006 | Kraner |
| 2008/0308749 | A1 | * | 12/2008 | Butler ......................... 250/492.1 |
| 2009/0091725 | A1 | * | 4/2009  | Van Der Wijst et al. ........ 355/53 |

FOREIGN PATENT DOCUMENTS

| EP | 1711724 A1 | 10/2006 |
| JP | 2007-120646 A | 5/2007 |
| JP | 2009-507359 T | 8/2007 |
| JP | 2009-127861 A | 6/2009 |
| JP | 2007-522393 T | 6/2011 |
| WO | 2005/085671 A1 | 9/2005 |

OTHER PUBLICATIONS

Machine translation of Japanese patent application JP 2005-314583 published as JP 2007-120646 on May 17, 2007.*
Office Action in related Japanese application No. 2008-290446 mailed May 9, 2011.

* cited by examiner

*Primary Examiner* — Hung Henry Nguyen
*Assistant Examiner* — Steven H Whitesell Gordon
(74) *Attorney, Agent, or Firm* — Pillsbury Winthrop Shaw Pittman LLP

(57) ABSTRACT

An active damping system to dampen a vibration of at least a part of the structure, including a device to determine a position quantity of the structure and an actuator to exert a force on the structure in dependency of the determined position quantity, wherein the device is a calculation device configured to calculate the position quantity of the structure on the basis of actuator signals.

20 Claims, 4 Drawing Sheets

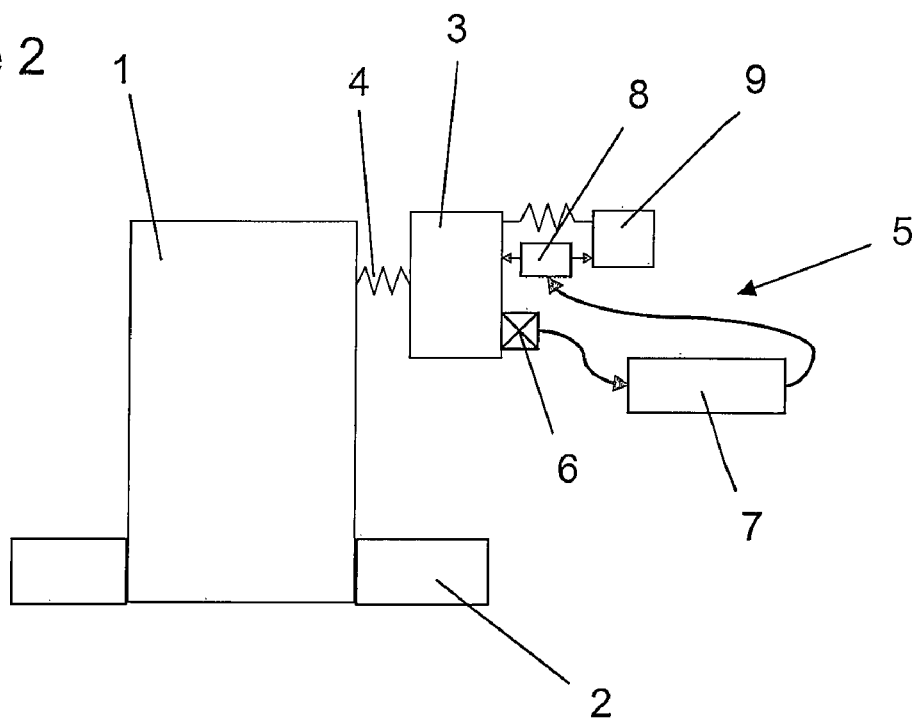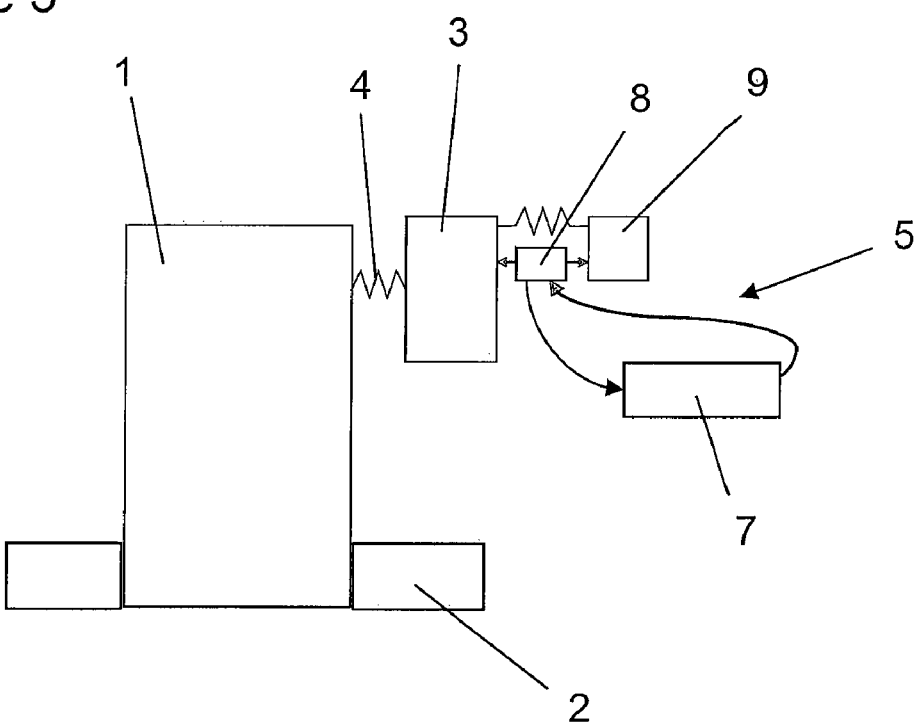

COMBINATION OF STRUCTURE AND AN ACTIVE DAMPING SYSTEM, AND A LITHOGRAPHIC APPARATUS

CROSS-REFERENCE TO RELATED APPLICATIONS

This application claims priority and benefit to U.S. Provisional Patent Application Ser. No. 60/996,503, entitled "COMBINATION OF STRUCTURE AND AN ACTIVE DAMPING SYSTEM, AND A LITHOGRAPHIC APPARATUS", filed on Nov. 20, 2007. The content of that application is incorporated herein in its entirety by reference.

FIELD

The present invention relates to a combination of a structure and an active damping system, and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to obtain a high accuracy and high resolution currently aimed at in lithography, it is desirable to accurately position parts of the lithographic apparatus such as the reticle stage to hold the patterning device (e.g. mask), the projection system and the substrate table to hold the substrate, with respect to each other. Apart from the positioning of e.g. the patterning device (e.g. reticle) stage and the substrate table, this may also pose requirements on the projection system. The projection system in current implementations may consist of a carrying structure, such as a lens mount (in case of transmissive optics) or a mirror frame (in case of reflective optics) and a plurality of optical elements such as lens elements, mirrors, etc. In operation, the projection system may be subject to vibrations due to a plurality of causes. As an example, movements of parts in the lithographic apparatus may result in vibrations of a frame to which the projection system is attached, a movement of a stage such as the substrate stage or the patterning device (e.g. reticle) stage, or accelerations/decelerations thereof, which may result in a gas stream and/or turbulence and/or acoustic waves affecting the projection system. Such disturbances may result in vibrations of the projection system as a whole or of parts thereof. By such vibrations, displacements of lens elements or mirrors may be caused, which may in turn result in an imaging error, i.e. an error in the projection of the pattern on the substrate.

Commonly, a damping system is provided to dampen vibrations of the projection system or parts thereof. Thereto, a passive damping system may be provided as known in many forms, or an active damping system, or a combination of a passive and a active damping system. In this document, the term active damping system is to be understood as a damping system which includes a device to detect or determine an effect of a vibration (e.g. a position sensor, velocity sensor, acceleration sensor, etc) and an actuator to act on the structure to be damped or a part thereof, the actuator being driven by e.g. a controller in dependency of a signal provided by the sensor. By driving the actuator in dependency of the signal provided by the sensor, an effect of the vibration on the projection system or a part thereof, may be reduced or cancelled to a certain extent. An example of such active damping system may be provided by a feedback loop; the sensor provides a position quantity (such as a position, speed, acceleration, jerk, etc of the projection system or a part thereof), which is fed into a controller, the controller generates a controller output signal to drive the actuator, and the actuator in turn acts on the projecting system or the part thereof so that a feedback loop is provided. The controller may be formed by any type of controller and may be implemented in the software to be executed by a microprocessor, microcontroller, or any other programmable device, or may be implemented by dedicated hardware.

It is desirable to obtain stability of the feedback loop, i.e. to achieve a frequency behavior of the feedback loop wherein ringing and/or oscillation is prevented. At the same time, a high bandwidth of the active damping system is desired, as a high bandwidth of the active damping system will allow to suppress vibrations within such high bandwidth. Due to the ever increasing demands on speed of the lithographic apparatus, movements in the lithographic apparatus tend to take place at a higher speed and consequently involving faster transients, which may result in a generation of vibrations at increasingly higher frequencies. Therefore, a demand comes forward towards a higher bandwidth of the active damping system.

A phenomenon that is encountered is that the projection system is commonly built up from a variety of parts, including e.g. lenses, mirrors and/or other optical elements, lens mountings and/or mirror mountings, a housing of the projection system such as a lens body, etc. As a consequence, a frequency behavior of the projection system starts, at a low frequency extreme, as a rigid body mass, thereby providing a transfer function from a force acting on the projection system to a velocity of the projection system which is inversely proportional to a frequency, assuming that the frame on which the projection system is mounted is already decoupled from the fixed world. In a resonance frequency range, a resonance of the projection system is observed, which may be followed by a plurality of further resonances with increasing frequency, thereby overall resulting in an increase of the magnitude of the transfer function. Effectively, as from the resonance frequency range, the projection system does not behave as a single object anymore, however instead shows a variety of resonance phenomena each corresponding to resonance of an element of the projection system. As a result thereof, the higher the frequency, the lower the remaining mass which "contributes" to the transfer function, which may be considered an explanation for the fact that the magnitude of the transfer function from a force acting on the projection system to a velocity of the projection system increases with increasing frequency, in the frequency range above the resonance frequency range.

As will be understood by a skilled person, the frequency behavior of the projection system as outlined above, may result in stability problems when attempting to achieve a bandwidth of the active damping system high enough to dampen resonances which reaches or exceeds the resonance of the projection system. The transfer function may be expressed in terms of e.g. velocity of the projection system as a function of a force on the projection system. It is noted that the transfer function may also be expressed in any other suitable quantity, such as acceleration of the projection system as a result of force on projection system. In that case, a low frequency behavior of the transfer function will show to be frequency independent, followed by a resonance frequency range and an increase of the transfer function (showing multiple resonance peaks) above the resonance frequency range.

A sensor is used in an active damping system to determine the position quantity of the projection system, typically the acceleration of the projection system. The quality of the sensor signal has to be high in order to obtain an optimal damping performance. However, the application of the sensor has some practical drawbacks.

Normally, the sensor may not be placed in one line with the actuator and will therefore be placed next to the actuator. As a result, it may not be perfectly collocated with the actuator. Due to this non-perfect collocation, the damping performance may be less.

Furthermore, the sensor, for instance a mass coupled to a piezo sensor, is generally capable of measuring the acceleration in a certain frequency range with high accuracy, but performance may become worse in other frequency ranges. Moreover, the sensor may include resonance frequencies in a relevant frequency range. In such case, the resonance frequencies may become determining for the achievable gain, and thus the damping performance.

Sensors with relative low resonance frequencies have typically a good performance in a low frequency range but limit the bandwidth of the active damping system. Sensors having relative high resonance frequencies perform typically well for higher frequencies and have correspondingly a higher bandwidth. However, performance for lower frequencies is relatively bad.

It is remarked that actuators used for an active damping system may have the same characteristics, i.e. actuators with lower resonance frequencies perform well for lower frequencies but have limited bandwidth, while actuators with higher resonance frequencies provide higher bandwidth but have lower performance for low frequencies.

SUMMARY

It is desirable to provide a combination of a structure and an active damping system wherein the damping performance of the active damping system is improved.

According to an embodiment of the invention, there is provided a combination of a structure, and an active damping system to dampen a vibration of at least a part of the structure, including a device to determine a position quantity of the structure and an actuator to exert a force on the structure in dependency of the determined position quantity, wherein the device is a calculation device configured to calculate the position of the structure on the basis of actuator signals.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate; wherein the lithographic apparatus further includes a combination of: a structure, and an active damping system to dampen a vibration of at least a part of the structure, including a device to determine a position quantity of the structure and an actuator to exert a force on the structure in dependency of the determined position quantity, wherein the device is a calculation device configured to calculate the position quantity of the structure on the basis of actuator signals.

According to an embodiment of the invention, there is provided a combination of a structure, and an active damping system to dampen a vibration of at least a part of the structure, including a device to determine a position quantity of the structure and an actuator to exert a force on the structure in dependency of the determined position quantity, wherein the device includes a first sensor configured to measure a position quantity of the structure in a low frequency range, a second sensor configured to measure a position quantity of the structure in a high-frequency range, a low-pass filter to filter a first signal of the first sensor, a high-pass filter to filter a second signal of the second sensor, and an addition device to combine output signals of the low-pass filter and the high-pass filter to a combined signal.

According to an embodiment of the invention, there is provided a combination of a structure, and an active damping system to dampen a vibration of at least a part of the structure, including: a device to determine a position quantity of the structure, a first actuator to exert a force on the structure in dependency of the determined position quantity in a low frequency range, and a second actuator to exert a force on the structure in dependency of the determined position quantity in a high frequency range.

According to an embodiment of the invention, there is provided an active damping system configured to dampen a vibration of at least part of a structure, the active damping system including a calculator configured to determine a position quantity of the structure; and an actuator configured to exert a force on the structure in dependency of the determined position quantity, wherein the calculator is configured to calculate the position quantity of the structure based on actuator signals.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and an active damping system configured to dampen a vibration of at least part of a structure, the active damping system including a calculator configured to determine a position quantity of the structure; and an actuator configured to exert a force on the structure in dependency of the determined position quantity, wherein the calculator is configured to calculate the position quantity of the structure based on actuator signals.

According to an embodiment of the invention, there is provided an active damping system configured to dampen a vibration of at least part of a structure, the active damping system including a device configured to determine a position quantity of the structure, the device including a first sensor configured to measure a position quantity of the structure in a low frequency range, a second sensor configured to measure a position quantity of the structure in a high-frequency range, a low-pass filter to filter a first signal of the first sensor, a high-pass filter to filter a second signal of the second sensor, and an adder to combine output signals of the low-pass filter and the high-pass filter to form a combined signal; and an actuator to exert a force on the structure in dependency of the determined position quantity.

According to an embodiment of the invention, there is provided an active damping system configured to dampen a vibration of at least part of a structure, active damping system including a device configured to determine a position quantity of the structure; a first actuator configured to exert a force on the structure in dependency of the determined position quantity in a low frequency range; and a second actuator configured to exert a force on the structure in dependency of the determined position quantity in a high frequency range.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts an active damping system;

FIG. 5 depicts an active damping system according to an embodiment of the invention;

DETAILED DESCRIPTION

Figure 1:
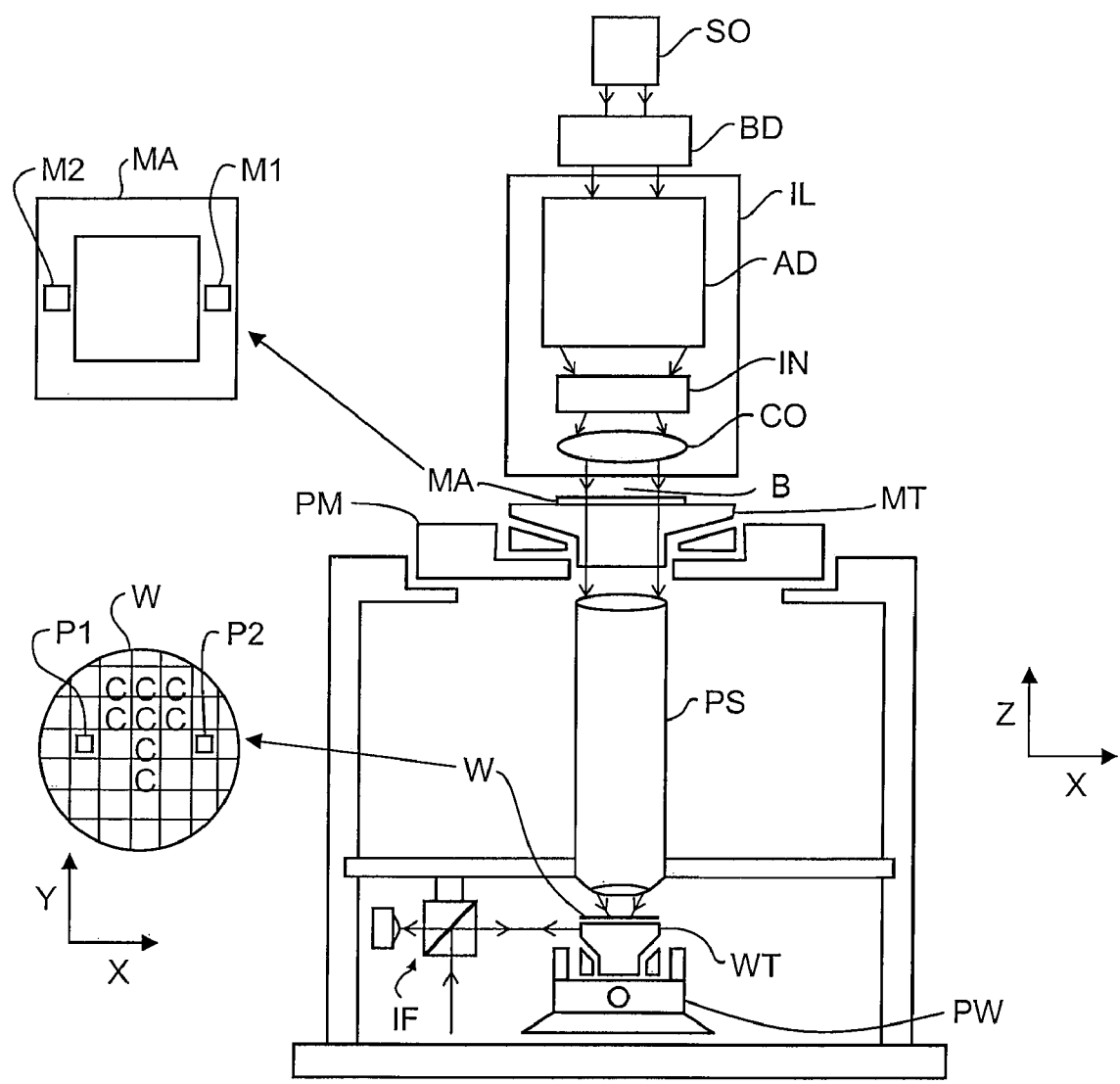
FIG. 1 depicts a lithographic apparatus in which an embodiment of the invention may be incorporated.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device support and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT or mask support and the substrate table WT or substrate support are kept essentially stationary, while an entire pattern imparted to the radiation beam is projected onto a target portion C at one time (i.e. a single static exposure). The substrate table WT or substrate support is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or mask support and the substrate table WT or substrate support are scanned synchronously while a pattern imparted to the radiation beam is projected onto a target portion C (i.e. a single dynamic exposure). The velocity and direction of the substrate table WT or substrate support relative to the patterning device support (e.g. mask table) MT or mask support may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or mask support is kept essentially stationary holding a programmable patterning device, and the substrate table WT or substrate support is moved or scanned while a pattern imparted to the radiation beam is projected onto a target portion C. In this mode, generally a pulsed radiation source is employed and the programmable patterning device is updated as required after each movement of the substrate table WT or substrate support or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 depicts a highly schematic view of a projection system 1, in this example held in a metrology frame 2. A projection system 1 may be held in the metrology frame 2 by any suitable devices, e.g. a rigid mounting, a resilient mounting, etc. An interface mass 3 which may include any object, preferably a rigid mass, is connected to the projecting system 2 using a resilient connection 4, preferably a damping connection.

An active damping system 5 is provided for active damping of vibrations of the projection system 1. The active damping system 5 includes a sensor 6, a controller 7 and an actuator 8.

A vibration of the projection system 1 results normally in a vibration of the interface mass 3, and will be sensed by a sensor 6. The same holds for a vibration of a part of the projection system (such as a lens element, mirror, or any other part thereof), which may likewise result in a vibration of the interface mass 3. Such vibration may be sensed by the sensor 6, which may be any type of vibration sensor, such as a position measurement sensor, a velocity measurement sensor, an acceleration measurement sensor, etc. An actuator 8 is provided which acts on the interface mass 3 on the basis of the sensor signal.

In the shown embodiment, the actuator 8 is connected to an inertial mass as a reaction mass 9, i.e. a mass which is connected to the actuator to counteract the forces exerted by the actuator 8 by making use of the inertia of the reaction mass, whereby the inertial mass 9 is free to move in the direction in which the actuator exerts a reaction force on the inertial mass 9. In alternative embodiments the actuator 8 may be mounted between a base frame of the lithographic apparatus (however any other reaction body or other reference may also be applied) and the interface mass 3.

The actuator 8 may be any suitable type of actuator, such as a piezo-electric actuator, a motor, etc, in a preferred embodiment use is made of a Lorentz actuator, as thereby a contactless actuator may be provided which does not provide for a mechanical contact between the reaction mass 9, other reaction body or reference, and the interface mass 3, as the Lorentz actuator may provide for a contactless exertion with respective parts connected to the reaction mass 9 and the interface mass 3 respectively.

The actuator 8 is driven using a suitable controller 7 in dependency of a signal provided by the sensor 6.

By providing a resilient connection between the interface mass 3 and the projection system 1 an effective decoupling of the vibrations and resonances of parts of the projection system may be provided in a frequency range above a certain roll-off frequency. By designing the roll-off frequency of the resilient connection 4 (i.e. the frequency above which a transfer of vibrations from the projection system 1 to the interface mass 3 substantially decreases), lower than a bandwidth of the active damping system, i.e. in other words by providing a bandwidth of the active damping system 5 which exceeds the roll-off frequency of connection 4, it is possible to benefit from the substantially resonance free behavior in that frequency band to promote a stable operation of the active damping system 5. The resilient connection 4 between the interface mass 3 and projection system 1 preferably includes a spring, such as a damped spring.

Since the sensor 6 and the actuator 8 are connected to the interface mass 3, instead of directly to the projection system 1, and the interface mass 3 in turn is connected to the projection system 1 via the resilient connection 4, the following effect is obtained. Below a certain roll-off frequency the behavior of the transfer function largely corresponds as if the sensor 6 and actuator 8 would be directly mounted on the projection system 1. A vibration of the projection system 1 results in a corresponding vibration in the interface mass 3, and vice versa. Above this frequency, the sensor 6 does not or substantially not observe anymore the vibrations and resonances of the projection system 1, or parts thereof, since the frequency behavior, as observed from the actuator 8 to the sensor 6, is substantially decoupled from the projection system due to the resilient connection 4.

Figure 3:
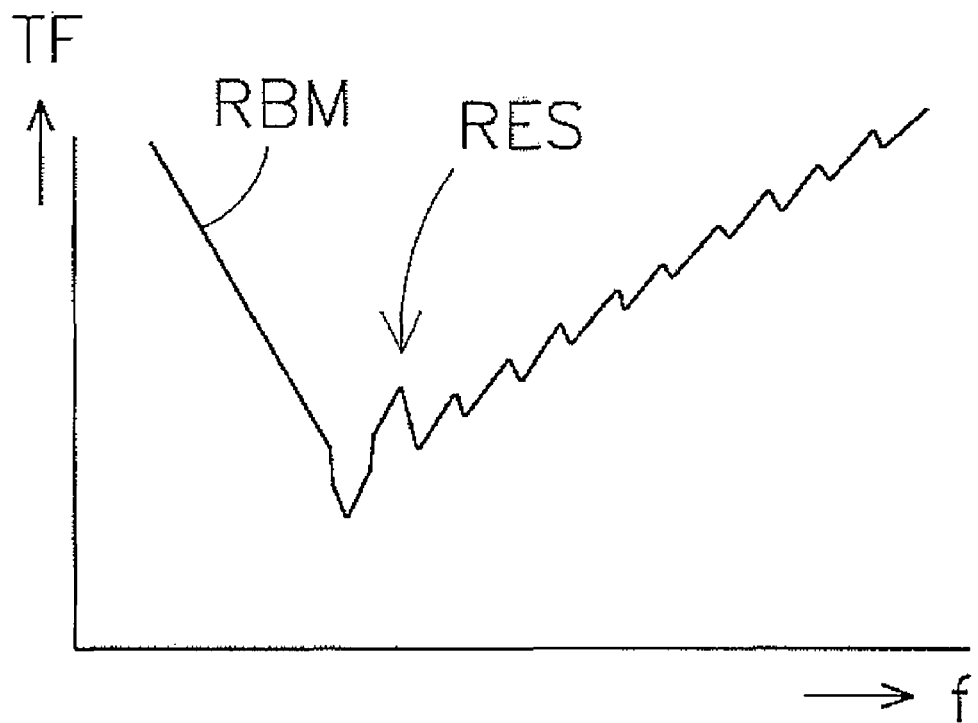
FIG. 3 depicts a frequency plot of a transfer function of a projection system of the lithographic apparatus.

As an example, FIG. 3 shows a transfer function TF from a force acting on the projection system 1 to a velocity of the projection system 1 which is inversely proportional to a frequency, assuming that the frame on which the projection system is mounted is already decoupled from the fixed world. In a resonance frequency range, a resonance RES of the projection system is observed, which may be followed by a plurality of further resonances with increasing frequency, thereby overall resulting in an increase of the magnitude of the transfer function.

Below the resonance frequency the projection system behaves as a rigid body mass RBM, but from the resonance frequency range, the projection system does not behave as a single object anymore, however instead shows a variety of resonance phenomena each corresponding to resonance of an element of the projection system. As a result thereof, the higher the frequency, the lower the remaining mass which "contributes" to the transfer function, which may be considered an explanation for the fact that the magnitude of the transfer function from a force acting on the projection system to a velocity of the projection system increases with increasing frequency, in the frequency range above the resonance frequency range.

Figure 4:
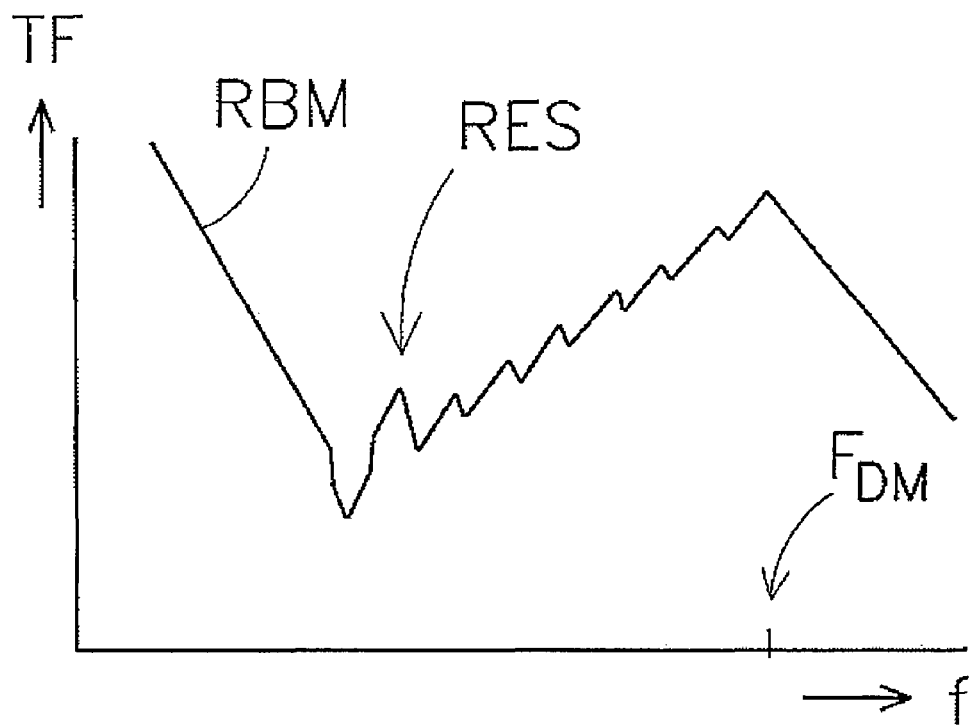
FIG. 4 depicts a frequency plot of a transfer function of a projection system of the lithographic apparatus, as observed by the active damping system according to FIG. 2.

FIG. 4 shows a transfer function TF from a force acting on the interface mass 3 to a velocity of the interface mass 3. Below the roll-off frequency $F_{DM}$, a behavior of the transfer function largely corresponds to that as depicted in FIG. 3, as below the frequency $F_{DM}$, a vibration of the projection system 1 results in a corresponding vibration in the interface mass 3, and vice versa. As of the frequency $F_{DM}$ the sensor 6 and actuator 8 do not or substantially not observe anymore the vibrations and resonances of the projection system 1, or parts thereof, instead the frequency behavior, as observed from the sensor 6 and the actuator 8, is dominated by the interface mass 3. Thus, FIG. 4 shows three frequency bands: a low frequency region RBM where the projection system behaves as rigid body mass, a resonant part RES and resonances of the projection system, and again a rigid body mass being provided by the interface mass 3. As a consequence, a phase of the transfer function as of the frequency $F_{DM}$ will show a more constant behavior, thereby possibly favoring a stable behavior of the active damping system including the sensor 6 and the actuator 8.

Thus, by provision of the interface mass 3 between the sensor 6/actuator 8 and the projection system, unfavorable high frequency behavior of the projection system 1 is no longer taken into account in the control loop of the active damping system 5. In practice, for even higher frequencies, the interface mass 3 may itself again show resonances. These resonances however should be beyond an effective bandwidth of the active damping system 5. As the interface mass 3 may have a weight and complexity lower than that of the projection system 1, such behavior may easily be achieved in a practical implementation.

The interface mass 3 may be connected to any relevant part of the projection system 1, in a practical implementation of a transmissive projection system, the interface mass may be connected to a lens mount (i.e. a mount for a plurality of lens elements thereof). In the case of a reflective projection system, the interface mass may be connected e.g. to a frame holding one or more of the mirrors. Thereby, the projection system and its constituting parts may be effectively damped, as connecting the interface mass (and therefore mediately connecting the active damping system) to the lens mount or frame will have effect on a plurality of constituting parts of the projection system, e.g. lens elements, mirrors, etc, as these constituting elements are all in turn connected to the lens mount or reference frame.

A mass of the interface mass 3 may typically be selected between 0.001 and 0.1 times a mass of the projection system 1, more preferably between 0.001 and 0.01 times the mass of the projection system 1, as thereby the roll-off frequency can be provided in a frequency range being within a desired bandwidth of the active damping system 5, thereby favoring a stable closed loop operation of the active damping system 5. The resulting mass of the interface mass 3 is typically in the range of 5-20 kg, for instance 10 kg.

A mass of the reaction mass 9 may typically selected between 0.1 and 0.001 times a mass of the interface mass 3, more preferably between 0.02 and 0.005. The reaction mass 9 in the shown embodiment is typically in the range of 0.05 kg and 0.2 kg, for instance 0.1 kg.

The above described active damping system is described in more detail in the co-pending application having U.S. application No. 60/960,579, the contents of which is herein incorporated in its entirety by reference.

With the active damping system 5 shown in FIG. 2, the sensor 6 may not be placed in one line with the actuator 8 and is therefore placed next to the actuator 8. As a result, it may not be perfectly collocated with the actuator 8, i.e. the main direction in which the actuator 8 may exert a actuation force and the main direction in which the sensor 6 measures an acceleration, or generally the position quantity do not overlap. Due to this non-perfect collocation, the damping performance of the active damping system 5 may not be optimal.

FIG. 5 shows an active damping system 5 according to an embodiment of the invention. In the embodiment of FIG. 5 no sensor is present. The sensor may be omitted as the velocity of the interface mass 3 and thus the structure is determined by a calculation device or calculator which is configured to calculate the velocity of the interface mass 3 on the basis of actuator signals. The calculation device or calculator may, in an embodiment, be part of controller 7. The calculator may, in an embodiment, include a processor, hardware, software or any combination thereof. Since the signals of the actuator 8 are used, the velocity is determined in exact the same location and direction as where the actuator exerts an actuation force on the interface mass 3. Thus "sensor" and actuator 8 are perfectly collocated.

An example of the calculation of the velocity will now be given on the basis of the clamp voltage $U_C$ and the current I of the actuator. Here, the actuator is of the Lorentz type.

The relative velocity $v_C$ between the reaction mass 9 and the interface mass 3 may be determined with the following equation:

$$v_C = 1/K(U_C - IR), \text{ wherein K is the motor constant and R is the resistance of the actuator.}$$

The velocity $v_M$ of the reaction mass may be determined by:

$$v_M = -F(1/m_R s),$$

wherein F is the exerted force which equals K*I, s is the Laplace operator, and $m_R$ is the mass of reaction mass 9. The absolute velocity $v_A$ of the interface mass 3 may be calculated as:

$$v_A = v_C + v_M$$

Thus on the basis of the signals of the actuator the absolute velocity of the interface mass 3 may be determined without the use of a sensor. It is remarked that this example is only valid above the lowest resonance frequency of the reaction mass, and that the inductance of the actuator 8 is not taken into account.

In the above example an interface mass 3 is provided between the projection system 1 and the actuator 8. In an alternative embodiment, the interface mass 3 may be omitted and the actuator 8 may be directly mounted on the projection system 1. Such embodiment may be used when the damping effect for higher frequencies as described in relation with embodiment shown in FIG. 2 is not needed.

Furthermore, the reaction mass 9 in the shown embodiment of FIG. 2 is an inertial mass, i.e. it is only connected to the actuator 8. In an alternative embodiment the actuator may be arranged between the interface mass 3/the projection system 1 and a rigid part of the lithographic apparatus, for instance a frame, such as the base frame or the metro frame. In such case, it may be assumed that the reaction mass, for instance the base frame does not move, or a sensor may be provided to measure the movement of the frame.

Figure 6:
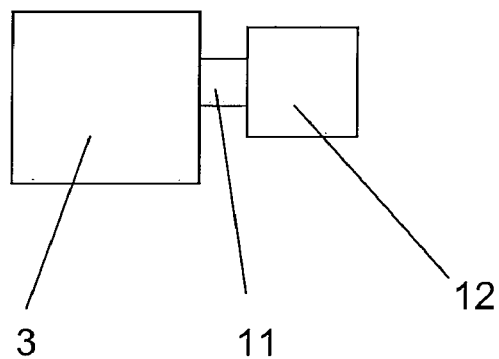
FIG. 6 depicts a piezo-element type sensor.

FIG. 6 shows an example of a sensor 6 which may be used as an acceleration sensor in an active damping system 5 as shown in FIG. 2. The sensor 6 is based on a piezo element 11 which is placed between the interface mass 3 and a measurement mass 12. The measurement mass 12 is a relatively small mass. When the interface mass 3 is moved the inertia of the measurement mass will cause a force to be exerted on the piezo element 11. This force will be measured by the piezo element. On the basis of the force the acceleration of the interface mass 3 may be determined.

The shown sensor-type is capable of measuring the acceleration in a certain frequency range with high accuracy, but performance may become worse in other frequency ranges. Also, the sensor may have resonance frequencies in a relevant frequency range due to the internal dynamics of the sensor, for instance in the embodiment of FIG. 2 at 15 kHz. This resonance frequency may become determining for the achievable gain, and thus the damping performance, in particular the bandwidth of the active damping system.

The resonance frequency is preferably high so that the bandwidth of the system may be optimized. The resonance frequency may be increased by decreasing the measurement mass 12 of the sensor. Such sensor will also perform well for higher frequencies, but performance for lower frequencies is relatively bad. It is also possible to provide a sensor with a relatively large measurement mass 12 to improve low frequency performance. However, the resonance frequencies of such sensor may also be lower, and thus have a negative impact on the bandwidth of the system.

Figure 7:
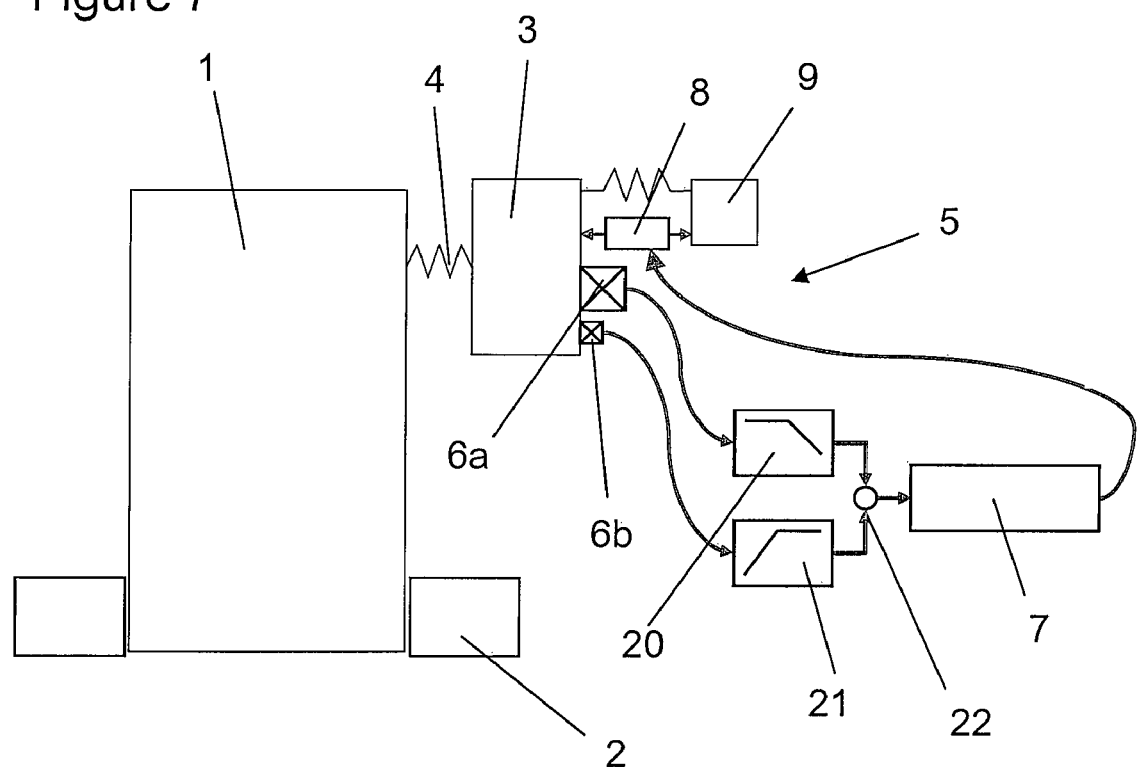
FIG. 7 depicts an active damping system according to another embodiment of the invention.

FIG. 7 shows an embodiment in which sensor performance may be increased. The same reference numbers have been used for the same or similar parts.

In the embodiment of FIG. 7, a first sensor 6a and a second sensor 6b are provided on the interface mass 3.

The first sensor 6a is a sensor performing well at relative low frequencies. For this reason, the first sensor 6a is provided with a relative large measurement mass. Such sensor will also have a relatively low resonance frequency, for instance in the 10 kHz range. The second sensor 6b is a sensor configured to perform well at higher frequencies and has correspondingly a higher resonance frequency. However, the performance at lower frequency may not be as good, e.g. noisy.

The measurement signal of the first sensor 6a is filtered in a low-pass filter 20. The roll-off frequency of the low-pass filter may be at 10 kHz or less to filter out the relative low resonance frequency of the first sensor 6a. The measurement signal of the second sensor 6b is filtered in a high-pass filter 21 to filter out the noisy low frequency signals.

The filtered signals are combined in a single signal in an addition device or adder 22 and fed to a controller 7. The controller 7 provides a control signal to drive the actuator to dampen vibrations of the interface mass 3/projection system 1. The low-pass filter 20, the high-pass filter 21 and the addition device or adder 22 may for instance be combined in single device, or combined with the actuator 8 in a controller unit.

The combined signal combines the best parts of signals the first sensor 6a and the second sensor 6b. The output signal of the first sensor 6a is used for a lower frequency range and the output signal of the second sensor 6b is used for a higher frequency range. Furthermore, the lower resonance frequency of the first sensor 6a is filtered out by the low-pass filter 20, therewith increasing the bandwidth of the active damping system 5. Thus overall performance of the measurement is increased while obtaining or maintaining a high bandwidth.

In the embodiment shown in FIG. 7 piezo-element acceleration sensors were used to explain the invention. However, other types of sensor have the same characteristics. Sensor may be accurate at lower frequency ranges, but have also lower resonance frequencies therewith limiting bandwidth, or sensors are accurate at higher frequency ranges, but are less accurate (noisy) at lower frequencies. The combination of first and second sensors and low-pass filter and high pass filter may also be used for such sensors.

In this respect, it will be appreciated that the term low-pass filter was used for a filter filtering out frequencies at and above the resonance frequency of the first sensor 6a and the term high-pass filter was used for a filter which filters low frequency measurement in the relevant frequency ranges. In practice any type of filter or combination of filters may be used to obtain this result. The invention is thus not limited to these exact types of filters. However, preferably the low-pass filter 20 and the high-pass filter 21 are each other's complement, such that $H_{low\text{-}pass}+H_{high\text{-}pass}=1$. Then, the combination of sensors 6a and 6b, and filters 20 and 21 together with the addition device or adder, behaves as one sensor that functions correctly over a wide frequency range, without phase impact in the control loop.

It will be appreciated that actuators used for an active damping system may have the same characteristics, i.e. actuators with lower resonance frequencies due to internal dynamics perform well for lower frequencies but have limited bandwidth, while actuators with higher resonance frequencies provide higher bandwidth but have lower performance for low frequencies.

In such case, it is possible to provide, in accordance with the above embodiment using a first sensor and a second sensor, an active damping system 5 having a first actuator and a second actuator. The first actuator is used for low frequency ranges and is thus configured to be accurate at lower frequencies, while a second actuator is provided for accurate actuation at higher frequencies. For instance, the first actuator may be connected to a large reaction mass, while the second actuator is connected to a small reaction mass. The control signal fed to the first and second actuator may be filtered by a low-pass filter for the first actuator and a high-pass filter for the second actuator.

By providing two actuators each being configured to perform well at a different frequency range, the total frequency range of the actuator(s) may be expanded, therewith improving overall damping performance of the active damping system 5.

Depending on the characteristics of the actual active damping system, two or more sensors and/or two or more actuators may be provided to provide optimal performance over a certain frequency range and a desired bandwidth. Band filters or similar may be provided to filter out the relevant frequency range of each respective sensor or actuator.

In the above example an interface mass 3 is provided between the projection system 1 and the actuator 8. In an alternative embodiment, the interface mass 3 may be omitted and the actuator 3 may be directly mounted on the projection system 1. Such embodiment may be used when the damping effect for higher frequencies as described in relation with embodiment shown in FIG. 2 is not needed.

Furthermore, the reaction mass 9 in the embodiment of FIG. 2 is an inertial mass, i.e. it is only connected to the actuator 8. In an alternative embodiment the actuator may be arranged between the interface mass 3/the projection system 1 and a rigid part of the lithographic apparatus, for instance a frame, such as the base frame or the metro frame.

Although in the above, the invention has been described with reference to a projection system of a lithographic apparatus, the invention may be applied to any projection system, or even more generally to any structure which is to be mechanically damped by a number of active damping systems. Thus, the invention as well as the embodiments described in this document may be provided as a lithographic apparatus including a projection system and a number of active damping systems, as a projection assembly including a projection system and a number of active damping systems, and as a combination of a structure and a number of active damping systems to dampen vibrations of the structure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An active damping system configured to dampen a vibration of at least part of a structure, the active damping system comprising:

a calculator configured to determine a position quantity of the structure; and an actuator configured to exert a force on the structure in dependency of the determined position quantity,
wherein the calculator is configured to calculate the position quantity of the structure based on actuator signals, and
wherein the actuator signals used for calculation of the position quantity are clamp voltage and current.

2. The active damping system of claim 1, further comprising a controller unit and wherein the calculator is at least partly comprised in the controller unit.

3. The active damping system of claim 1, wherein the structure is a projection system.

4. The active damping system of claim 1, wherein the actuator is a piezo-electric actuator or a Lorentz actuator.

5. The active damping system of claim 1, wherein the calculator is in communication with the actuator so as to receive the actuator signals from the actuator.

6. The active damping system of claim 1, wherein the calculator is configured to calculate the position quantity of the structure without using a sensor signal representative of a vibration of on an object to which said actuator is connected.

7. The active damping system of claim 6, wherein said object is an interface mass mounted on the structure.

8. An active damping system configured to dampen a vibration of at least part of a structure, the active damping system comprising:
a calculator configured to determine a position quantity of the structure; and
an actuator configured to exert a force on the structure in dependency of the determined position quantity,
wherein the calculator is configured to calculate the position quantity of the structure based on actuator signals, and
wherein an interface mass is mounted on the structure, and the actuator is connected to the interface mass without directly contacting the structure so that, in use, the force is exerted on the structure via the interface mass.

9. The active damping system of claim 8, wherein the actuator is connected to an inertial reaction mass on which a reaction force is exerted.

10. The active damping system of claim 9, wherein said inertial reaction mass is arranged without directly contacting the structure.

11. An active damping system of configured to dampen a vibration of at least part of a structure, the active damping system comprising:
a calculator configured to determine a position quantity of the structure; and
an actuator configured to exert a force on the structure in dependency of the determined position quantity,
wherein the calculator is configured to calculate the position quantity of the structure based on actuator signals, and
wherein the actuator is connected to an inertial reaction mass on which a reaction force is exerted, said inertial reaction mass being arranged without directly contacting the structure.

12. An active damping system, configured to dampen a vibration of at least part of a structure, the active damping system comprising:
a calculator configured to determine a position quantity of the structure; and
an actuator configured to exert a force on the structure in dependency of the determined position quantity,
wherein the calculator is configured to calculate the position quantity of the structure based on actuator signals,
wherein the actuator is connected to an inertial reaction mass on which a reaction force is exerted, and
wherein the position quantity is a velocity of the structure which is determined by the velocity of the reaction mass and a difference between the relative velocity between the structure and the reaction mass.

13. The active damping system of claim 12, wherein the relative velocity is based on a difference between a clamping voltage of the actuator and a current times the resistance of the actuator.

14. The active damping system of claim 12, wherein the velocity of the reaction mass is determined from the integrated exerted force.

15. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate; and
an active damping system configured to dampen a vibration of at least part of a structure, the active damping system comprising
a calculator configured to determine a position quantity of the structure; and
an actuator configured to exert a force on the structure in dependency of the determined position quantity,
wherein the calculator is configured to calculate the position quantity of the structure based on actuator signals, and wherein the actuator signals used for calculation of the position quantity are clamp voltage and current.

16. The lithographic apparatus of claim 15, wherein the structure is the projection system.

17. The lithographic apparatus of claim 15, wherein the actuator is a piezo-electric actuator or a Lorentz actuator.

18. The lithographic apparatus of claim 15, wherein the calculator is in communication with the actuator so as to receive the actuator signals from the actuator.

19. The lithographic apparatus of claim 15, wherein the calculator is configured to calculate the position quantity of the structure without using a sensor signal representative of a vibration of on an object to which said actuator is connected.

20. The lithographic apparatus of claim 19, wherein said object is an interface mass mounted on the structure.

* * * * *